United States Patent [19]

Krage

[11] Patent Number: 4,588,953

[45] Date of Patent: May 13, 1986

[54] MICROWAVE PISTON POSITION LOCATION

[75] Inventor: Mark K. Krage, Royal Oak, Mich.

[73] Assignee: General Motors Corporation, Detroit, Mich.

[21] Appl. No.: 522,105

[22] Filed: Aug. 11, 1983

[51] Int. Cl.[4] .............................................. G01R 27/04
[52] U.S. Cl. .............................. 324/58.5 C; 91/189 R
[58] Field of Search ..................... 324/58.5 C, 58.5 B, 324/58.5 R, 58 C, 58 R; 91/189 R; 92/5 R

[56] References Cited

U.S. PATENT DOCUMENTS

| | | | |
|---|---|---|---|
| 3,589,177 | 6/1971 | Merlo | 324/58.5 C X |
| 4,384,480 | 5/1983 | Krage et al. | 73/116 |
| 4,403,504 | 9/1983 | Krage et al. | 324/58.5 B X |

FOREIGN PATENT DOCUMENTS 1173438 12/1969 United Kingdom .

OTHER PUBLICATIONS

Martin, New Applications Open for Reciprocal Frequency Counters, EDN, Oct. 5, 1974, pp. 44–47.

*Primary Examiner*—Stanley T. Krawczewicz
*Attorney, Agent, or Firm*—C. R. Meland

[57] ABSTRACT

A microwave method and apparatus for detecting the position of a piston of a pneumatic cylinder. While the piston is being moved by fluid pressure a microwave signal is applied to a cavity defined by the piston and interior of the cylinder and the reflected microwave signal is detected. The reflected microwave signal is processed to determine piston position.

6 Claims, 11 Drawing Figures

MICROWAVE PISTON POSITION LOCATION

This invention relates to a microwave method and apparatus for locating the position of a piston that reciprocates within a pneumatic or hydraulic cylinder.

Pneumatic and hydraulic cylinders are extensively used in conjunction with manufacturing equipment for, among other things, moving, positioning and clamping parts. In order to properly control these cylinders, some means must be provided to determine the position of the piston as it goes through its cycle of operation. As an example, specific piston positions in a given cylinder may be sensed for properly sequencing the actuation of other cylinders. In other types of operations, the position of the piston may have to be controlled over the entire length of its travel.

One method of indicating specific piston positions is through limit switches which are tripped by a mechanical link coupled to the piston rod. Where position information is required over the entire length of piston travel, a linear encoder can be mechanically coupled to the piston rod by, for example, a rack and pinion arrangement.

The devices for detecting piston position that have just been described all require some type of mounting surface or bracket and a mechanical connection between the piston rod and the position sensing equipment. The brackets, the mechanical links and the electro-mechanical position sensing equipment take up space and can be a limiting factor in the number of operations that can be performed at a given work station.

Another disadvantage of electro-mechanical position sensors is that the work station or manufacturing equipment must be designed to make provision for the switches, encoders and associated bracket and mounting surfaces solely for the purpose of measuring piston travel. During equipment set up, adjustments of trip points must be done manually with equipment turned off. In general, the setting up of the equipment can be time consuming and complicated.

One of the objects of this invention is to provide a piston position measuring apparatus and method that does not require a mounting bracket or a mechanical connection between the piston rod and a position sensor and hence eliminates the disadvantages of electro-mechanical piston position sensing. In carrying this object forward, a microwave signal is applied to a cavity that is defined by the piston and cylinder and a reflected microwave signal from the cavity is sensed. The amplitude and phase of the reflected signal is a function of piston position and is utilized to determine piston position. With this arrangement, the only connection to the cylinder that is required is a single coaxial cable that operates to couple microwave energy to and from the cylinder via an antenna or probe that communicates with the cylinder.

Another object of this invention is to provide an arrangement for effectively supplying microwave energy to a piston-cylinder combination that has a pneumatic stop that is provided by a cylinder end cap which is recessed to accommodate a portion of the piston rod that extends axially of the piston.

Another object of this invention is to provide a microwave piston position detecting apparatus that provides an indication of one desired piston position when the piston is moving in one direction and provides an indication of a second desired piston position when the piston is moving in the opposite direction. In carrying this object forward, a microwave signal of one frequency is supplied to the cylinder when the piston is moving in one direction and a microwave signal of a different frequency is supplied to the cylinder when the piston is moving in an opposite direction.

Another object of this invention is to provide a method and apparatus for determining piston position where the frequency of the microwave signal that is applied to the cylinder is repeatedly swept between two limits as the piston is moving in the cylinder. The reflected signal is processed to determine the number of resonant peaks that occur and to determine the frequency of the signal applied to the cylinder at the time one or more selected resonant peaks occur. A look-up table of values is provided that relates the distance or displacement of the piston from one end of the cylinder to the number of resonant peaks that occur and the frequency of the input signal at the time certain resonant peaks occur. The look-up table can take the form of a read-only memory which is addressed to retrieve piston position information. The frequency of the microwave signal is swept between a high and a low frequency and the resonant peaks that are selected for frequency determination are preferably those that occur at the high end of the frequency range, for example the first two peaks that occur as the frequency sweeps from the higher frequency to the lower frequency.

A further object of this invention is to provide a microwave encoder that is capable of developing electrical signals that represent a plurality of piston positions as the piston moves through the entire length of the cylinder.

This invention makes use of the fact that when a microwave signal is applied to a cavity defined by the piston and cylinder of a pneumatic or hydraulic actuator a sensed reflected signal will vary, depending upon the frequency of the signal supplied to the cavity and the amount of displacement of the piston from an end of the cylinder. For example, if the frequency of the input microwave signal is constant and the piston shifted, the amplitude of the reflected signal may exhibit one or more resonant peaks that are related to piston displacement. If the piston remained stationary and the input frequency is varied the amplitude of the reflected signal may again exhibit one or more resonant peaks.

Figure 1:
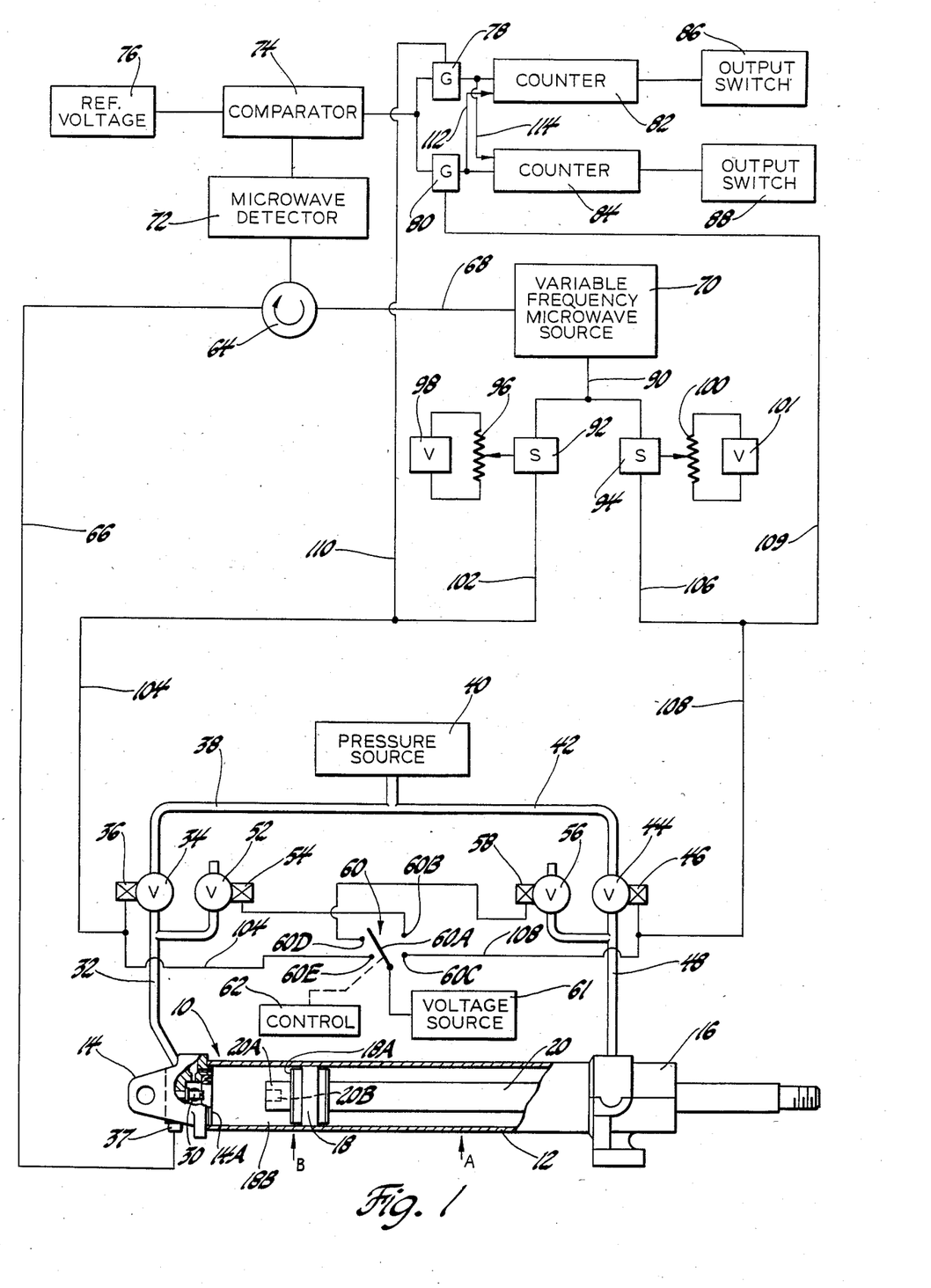
FIG. 1 is a schematic circuit diagram of a microwave position sensing apparatus made in accordance with this invention.
Figure 2:
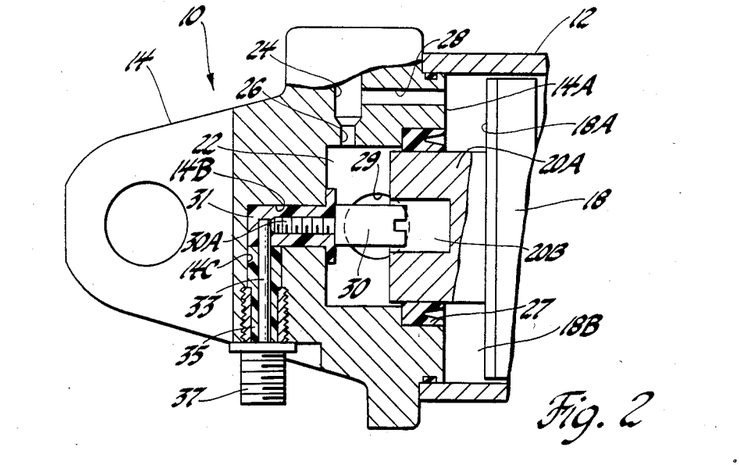
FIG. 2 is a view partly in section of an end cap for a pneumatic cylinder made in accordance with this invention.

Referring now to the drawings and more particularly to FIG. 1, a microwave system is illustrated for detecting the position of a piston relative to an end of a cylinder in either direction of movement of the piston. In FIG. 1, the reference numeral 10 generally designates a conventional pneumatic actuator that can be used, for example as a part positioner or the like in a manufacturing operation. The actuator 10 comprises a cylinder designated by reference numeral 12 and a pair of end caps 14 and 16 which are connected to the cylinder 12. A piston 18 reciprocates within the cylinder 12 and is connected to a piston rod 20. The piston rod 20 is adapted to be connected to any device that is to be operated by the actuator 10. The end cap 14, as is best illustrated in FIG. 2, has an annular recessed portion or bore 22 which communicates with a port 24 via a restricted passage 26. A passage 28 connects the port 24 and the interior of the cylinder 12. The port 24 is threaded to accommodate a pin type valve (not illustrated) that controls air flow between passages 28 and 26. The piston rod 20 has a portion 20A that extends axially from piston 18 which moves into the bore 22 when the piston 18 is moved completely to the left in FIGS. 1 and 2. The portion 20A slides into an annular seal 27 formed of a suitable plastic material. The bore 22 is connected to a side port 29 which serves either to supply air to or exhaust air from bore 22. In the system shown in FIG. 1 the side port 29 is connected to pipe or conduit 32. The axially extending portion 20A has a central bore 20B which receives a microwave probe antenna designated by reference numeral 30. The purpose of the axially extending portion 20A and the bore 22 is to provide a pneumatic stop or cushion for the piston 18 when it is moved fully to the left in FIGS. 1 and 2 such that end wall 18A of the piston engages wall 14A of end cap 14. Thus, as the portion 20A of the piston rod moves into the annular recess or bore 22 the only exhaust path for air from cavity 18B to port 29 is through passages 28, 24 and 26. These passages are restricted and as a result the impact of piston 18 against end cap 14 is cushioned.

The microwave antenna 30, as best illustrated in FIG. 2, takes the shape of a cylindrical axially extending rod. The antenna 30 is formed of a metallic material such as brass and is fixed to end cap 14 by an integral threaded portion 30A that is threaded into insulator 31. The insulator 31 is fixed to end cap 14 and disposed within bore 14B. A conductor 33 is disposed within an insulator 35 that is fixed to end cap 14 and located in bore 14C. The conductor 33 is connected to a conductor of a coaxial cable connector 37. The end of threaded portion 30A engages the inner end of conductor 33 to provide an electrical connection therebetween. As an alternative the end of threaded portion 30A may be provided with a hole to tightly receive an end of conductor 33 and if desired portion 30A and an end of conductor 33 could be electrically connected by an electrically conductive epoxy adhesive. The port 29, as previously mentioned, is connected to a pipe or conduit 32 which, in turn, is connected to a solenoid valve comprised of a valve 34 and a solenoid 36. The opposite side of valve 34 is connected to a pipe 38 which, in turn, is connected to a source of compressed air 40. The source of compressed air 40 is also connected to a pipe 42 that is, in turn, connected to one side of a solenoid operated valve 44. The valve 44 can be opened when the solenoid 46 is energized. The opposite side of valve 44 is connected to a pipe 48 which, in turn, is connected to a side port (not illustrated) formed in end cap 16 that communicates with the interior of the cylinder 12.

The system of FIG. 1 further includes a pair of solenoid valves comprised of valve 52 and solenoid 54 and valve 56 and solenoid 58. The valves 52 and 56, when opened respectively, connect the pipe 32 and pipe 48 to atmosphere.

The operation of the solenoid valves is controlled by a switch generally designated by reference numeral 60 connected to voltage source 61. The switch 60 has a movable contact 60A and fixed contacts 60B, 60C, 60D and 60E. The position of the movable contact 60A is controlled by a control device designated by reference numeral 62. The control device 62 is actuated to cause desired movement of the piston rod 20 or, in other words, is arranged to cause certain operations at a work station or in a machine tool to be performed under the control of the device 62.

Assuming now that it is desired to move the piston 18 and piston rod 20 to the right in FIG. 1, the movable contact 60A is shifted into engagement with fixed contacts 60D and 60E. It can be seen from the circuit diagram of FIG. 1 that this will cause the solenoids 36 and 58 to be energized. The energization of solenoid 36 opens valve 34 to connect the pressure source 40 with the cavity 18B. The energization of solenoid 58 opens valve 56 to connect pipe 48 to the atmosphere and consequently connect the cylinder at the right side of piston 18 to atmosphere. The piston 18 will now be moved to the right in FIG. 1 since the left side of the piston 18 is pressurized and the right side thereof is connected to atmosphere.

If it is desired to move the piston 18 to the left in FIG. 1, the contact 60A is shifted to a position where it engages fixed contacts 60B and 60C. This will energize the solenoids 46 and 54 to respectively open valves 44 and 52. This will cause the right side of the cylinder 12 to be pressurized and the left side to be connected to atmosphere. Accordingly, the piston 18 will be shifted to the left in FIG. 1.

The microwave antenna 30 is connected to one port of a conventional three port microwave circulator that is designated by reference numeral 64. This connection is via, for example, a coaxial cable designated by reference numeral 66 which is connected to connector 37. Another port of the microwave circulator 64 is connected to a coaxial cable 68 which, in turn, is connected to the output of a variable frequency microwave signal source 70. The third port of the circulator 64 is connected to a microwave diode detector 72. The microwave diode detector 72 is connected to a voltage comparator designated by reference numeral 74. The voltage comparator 74 compares the voltage supplied to it by the microwave detector 72 with a reference voltage provided by reference voltage source 76. The output of the comparator 74 is connected to a pair of gate circuits 78 and 80. These gate circuits, when conductive, connect the output of the comparator 74 with either digital counter 82 or 84. The counter 82 is connected to an output switch designated by reference numeral 86 and the output of counter 84 is connected to an output switch 88.

The variable frequency microwave signal source 70 is of a type that is capable of varying its output frequency as a function of an input voltage signal applied to it via conductor 90. The voltage applied to conductor 90 is controlled respectively by switches 92 and 94. When switch 92 is conductive it applies a voltage to conductor 90 that is developed by a potentiometer resistor designated by reference numeral 96 that is connected to a voltage source 98. The voltage applied to conductor 90 has another value when the switch 94 is conductive to apply the voltage developed across potentiometer resistor 100 to conductor 90. The potentiometer resistor 100 is connected to a voltage source 101. The switch 92 is connected to a conductor 102 which, in turn, is connected to a conductor 104. The conductor 104 is connected to the fixed contact 60E. The switch 94 is connected to a conductor 106 which, in turn, is connected to a conductor 108. The conductor 108 is connected to the fixed contact 60C. The conductor 106 is connected to conductor 109 which, in turn, controls the conduction of gate circuit 80. The conductor 102 is connected with a conductor 110 which, in turn, controls the conduction of gate circuit 78. The gates 78 and 80 and the switches 92 and 94 can take various known configurations as long as they are operative to make electrical connections in response to an input signal. In the system of FIG. 1, the circuit is arranged such that the switch 92 and the gate 78 are both conductive whenever the movable contact 60A is shifted to a position engaging fixed contacts 60D and 60E. When contact 60A engages fixed contacts 60B and 60C the gate 80 and switch 94 are biased conductive.

The operation of the system illustrated in FIG. 1 will now be described. Assuming that the piston 18 has been moved all the way to the left in FIG. 1, the movable contactor 60A will be in the position engaging fixed contacts 60B and 60C. This will bias the gate 80 conductive to thereby connect the output of comparator 74 to the counter 84 and will cause the counter 82 to be reset to zero via reset conductor 112. Assuming that it is desired to move the piston 18 to the right in FIG. 1 and to develop a signal when the end 18A of the piston reaches the position designated as point A the movable contact 60A is shifted to engage fixed contacts 60D and 60E. This movement of contactor 60A will bias gate 78 and switch 92 conductive and bias gate 80 and switch 94 nonconductive. Counter 84 will be reset to zero via reset conductor 114 that couples the output of gate 78 to a reset terminal of counter 84. Since switch 92 is conductive, it applies the voltage developed across the potentiometer resistor 96 to the variable frequency source 70 and the output of this source is now set at some frequency which will be designated as F-1. The portion of the cylinder to the left of piston 18 will now be pressurized and the opposite side of the cylinder to the right of piston 18 will be connected to atmosphere with the result that the piston 18 moves to the right in FIG. 1. The cavity 18B defined by the cylinder 12, the left end of piston 18 and the end cap 14 will be supplied with a microwave signal at the frequency F-1. As the piston 18 moves to the right in FIG. 1, one or more microwave resonances will be developed in the cavity 18B, depending on the frequency F-1 and the distance between the left end of piston 18 and the wall 14A of end cap 14. As resonance occurs, a sharp amplitude variation takes place (resonant peak) and this reflected signal is applied via cable 66 and circulator 64 to the microwave detector 72. The system is arranged such that when a resonance occurs the magnitude of the voltage supplied to the comparator 74, by the microwave detector 72, exceeds the reference voltage source 76 with the result that the counter 82 is incremented at each resonance developed in the cavity 18B. The counter 82 therefore is incremented at each resonant length of the piston 18 from wall 14A and the counter 82 counts the number of resonances that occur as the piston traverses from left to right. As mentioned, it is desired that a signal be developed when the left edge 18A of the piston 18 reaches point A of FIG. 1. To accomplish this, the system is arranged such that the cavity 18B, to the left of the piston 18, will resonate a predetermined number of times at the frequency F-1 as the piston 18 moves from the end cap 14 to a position corresponding to point A. The counter 82 is arranged such that when the predetermined number of resonant events has occurred the counter develops an output to turn on the output switch 86. The switch 86 may be, for example, a transistor which is biased conductive when it receives a signal from the counter 82. To summarize, the output switch 86 is biased conductive to develop an electrical signal or other switching function at the instant that the left end 18A of piston 18 reaches the point designated as A in FIG. 1.

The system of FIG. 1 is capable of identifying another position when the piston 18 is moving from right to left in FIG. 1. This position is designated as B and when the piston 18 is moving from right to left and reaches the position B, the output switch 88 is biased conductive. In order to detect the other position B as the piston 18 is moving from right to left in FIG. 1, the frequency of the microwave signal supplied to the cavity 18B is changed. The frequency of this signal will be designated as F-2 and will be appreciated, by those skilled in the art, that this frequency must be selected such that as the piston moves away from the end cap 16, a certain number of resonances must occur before the piston reaches the position B. During the movement of the piston 18 from right to left in FIG. 1 it will, of course, be appreciated that the movable switch contactor 60A will have been shifted to a position engaging fixed contacts 60B and 60C so that counter 82 is reset to zero and counter 84 will count the resonant amplitude variations as the piston 18 moves from a position engaging end cap 16 to the position B. The change in frequency to a frequency F-2 is accomplished in the system of FIG. 1 by the fact that when the movable contact 60A engages fixed contacts 60B and 60C, the switch 94 is gated conductive to apply the voltage developed across potentiometer resistor 100 to the conductor 90. This voltage is different from the voltage developed across potentiometer resistor 96 and the voltages developed respectively by potentiometer resistors 96 and 100 are selected to provide respectively the frequencies F-1 and F-2.

In summary, the system of FIG. 1 varies the frequency applied to the cylinder 12, depending upon the direction of movement of the piston 18, and develops an electrical signal at one position of the piston, namely position A, when the piston is moving in one direction, and develops an electrical signal at another position, namely position B, when the piston is moving in an opposite direction. One of the advantages of utilizing different frequencies for different directions of movement of the piston 18 is the flexibility of the system in developing electrical signals at certain positions of the piston. If a single frequency were utilized, the resonances must necessarily occur at certain predetermined positions of the piston regardless of whether the piston is moving to the left or right in FIG. 1.

By utilizing a different frequency F-2, as the piston moves from right to left in FIG. 1, it is possible to develop other resonant positions of the piston spaced from the resonant positions that would be developed by frequency F-1 so the system has added flexibility in determining piston positions. Further, by utilizing the different frequencies F-1 and F-2 for different directions of movement of the piston 18, it is possible to select frequencies such that only one resonance will occur as the piston moves to a limit or desired detectable position. Thus, the frequency F-1 could be selected so that a single resonance occurs in the cylinder 12 only when the piston 18 reaches position A, and frequency F-2 could be selected such that only one resonance occurs in the cylinder when the piston reaches another position, for example position B. This simplifies the signal processing circuit since neither counter 82 nor 84 would now be required, that is, the comparator 74 would develop only one output signal as the piston traverses the cylinder 12 from right to left in FIG. 1 and when the piston is moving from left to right in FIG. 1. Thus, the output of the comparator 74 could be connected to a single output switching device which would develop a signal at predetermined positions of the piston 18. In such a system, the frequency F-1, corresponding to position A, and corresponding to left to right movement of piston 18, would have a lower frequency than the frequency F-2 which would correspond to the right to left movement of piston 18 and to a detected position corresponding to position B.

The frequencies F-1 and F-2 can, of course, be adjusted by varying the positions of the sliders of the respective potentiometer resistors 96 and 100 so that the desired piston positions at which a signal is to be developed can be varied to suit the application. This means that where the actuator 10 is utilized to perform some operation on a machine tool or at a work station, the so-called "limit" or desired positions that are to be detected can be varied to suit the particular application.

Figures 3, 4:
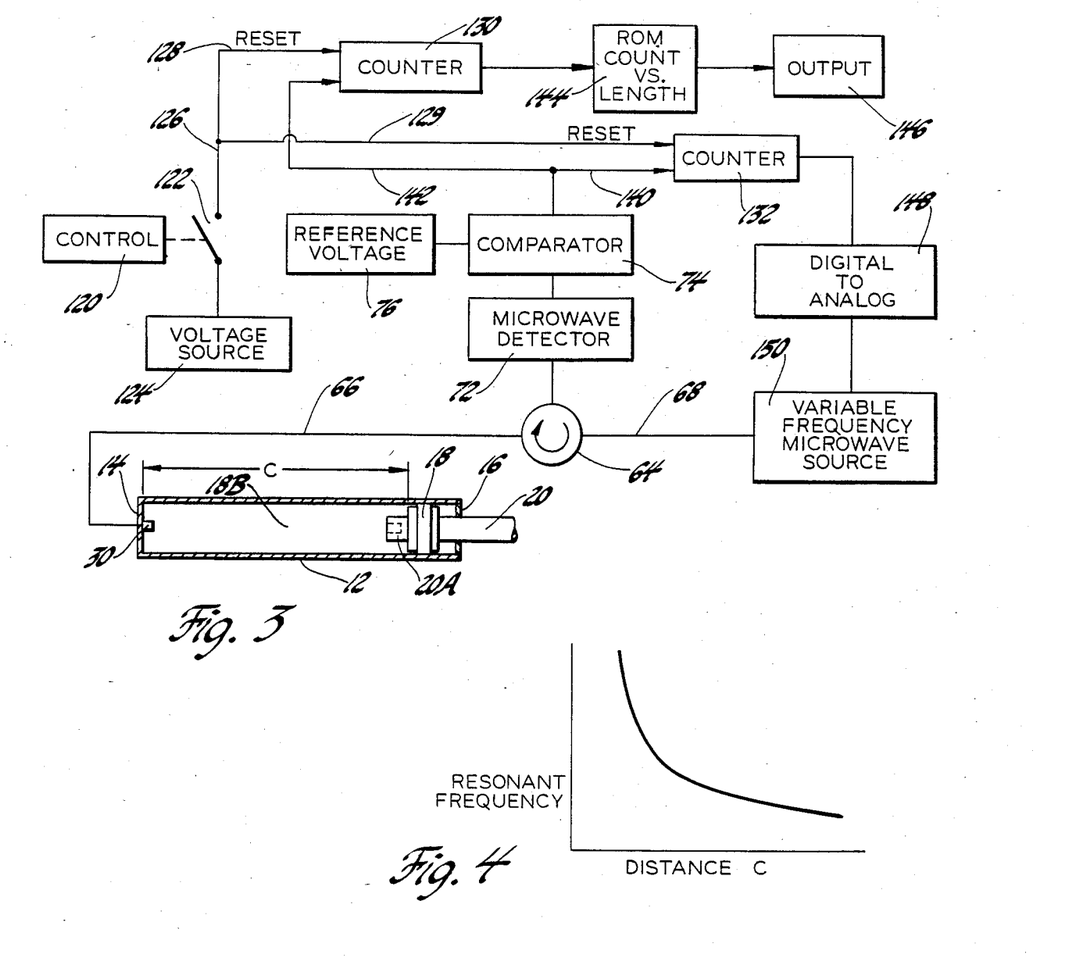
FIG. 3 is a schematic circuit diagram of a microwave system which is capable of providing an electrical signal that is a function of piston position as it moves through the entire length of the cylinder.
FIG. 4 is a graph relating piston position to resonant frequency.

Referring now to FIG. 3, a system is illustrated which is capable of providing an electrical encoder function, that is, that provides signals representing the instantaneous positions of a piston as it traverses the entire length of the cylinder. In order to simplify the description of the FIG. 2 arrangement, the valves for supplying air to, and exhausting air from the cylinder 12, have not been illustrated and where appropriate the same reference numerals have been utilized in FIG. 3 as were used in FIG. 1 to identify corresponding parts. It will be assumed in FIG. 3 that the control device 120 controls an electrical switch 122 connected to a voltage source 124. The closure of electrical switch 122 will cause the cavity at the right side of piston 18 to be pressurized and the opposite end of the cylinder to be connected to atmosphere to cause the piston 18 to move from a position fully to the right to a position engaging the left end of the cylinder 12. This can be accomplished by the solenoid valve arrangement illustrated in FIG. 1. The control switch 122 is connected to a conductor 126 which, in turn, is connected to reset conductors 128 and 129. When the switch 122 is closed, the digital counters 130 and 132 are both reset to a zero or reference count. The counters 130 and 132 are connected to the output of the comparator 74 by conductors 140 and 142. The arrangement is such that each time that the signal developed by the microwave detector 72 exceeds the reference voltage 76, which corresponds to the piston 18 attaining a position that causes a resonant condition in the cavity 18B the comparator 74 develops an output which causes counters 130 and 132 to be incremented by one count.

The output of counter 130 is applied to a read only memory designated by reference numeral 144 which contains a look-up table of values of pulse count versus the variable length C between the left end of piston 18 and end cap 14 which is illustrated in FIG. 3. That is, the read only memory 144 receives the count attained by counter 130 and translates this into a length C. The output of the read only memory 144 is applied to an output device 146 which may take the form of a digital read out or any other control device that can utilize the pulse count as a measure of the displacement of the piston 18. As an alternative, the output of the counter 130 can be utilized in various ways in order to control machine tool or work station functions since its count will represent the distance C of the piston 18 from the end cap 14.

The output of counter 132 is applied to a digital to analog converter 148 which, in turn, is coupled to a variable frequency microwave source 150 whose output frequency is a function of the output voltage of the converter 148.

The operation of the system illustrated in FIG. 3, as a position sensing encoder, will now be described. Assuming that piston 18 has been moved all the way to the right, that is, to a position against the end cap 16, the counters 130 and 132 are set to zero. If the control switch 122 is now closed, the cylinder 12 is suitably pressurized to cause the piston 18 to begin its movement from right to left in FIG. 3. The output frequency of the microwave source 150 will now have a predetermined value which will cause a resonant condition in the cavity 18B as the piston moves a predetermined distance away from the end cap 16. When this resonant condition occurs, the comparator 74 develops an output signal which increments the counters 130 and 132 by one count. When counter 132 has been incremented, it causes the output voltage of the digital to analog converter 148 to increase by an amount corresponding to the increment in the count of counter 132. This causes the output frequency of the microwave source 150 to be incremented by a predetermined amount so that a new frequency is applied to the cavity 18D with a corresponding different resonant position of the piston 18.

FIG. 4 illustrates the variation in resonant frequency with variation in the distance C as depicted in FIG. 3. Thus, as the distance C decreases, the frequency required to cause resonance in the cylinder cavity 18B increases. In the system of FIG. 2, the incrementing of the counter 132 causes the frequency to increase by an amount such that a certain portion of the length C must be traversed in order to cause the cylinder to resonate at the next higher frequency. Each time a resonance is detected, the counter 130 is, of course, incremented and its count therefore corresponds to incremental movement of the piston 18 by predetermined amounts. The count in counter 130 therefore represents the distance C as measured from the reference position of the piston 18 engaging the end cap 16.

If it were desired to determine the distance C from a reference position at which the piston 18 initially was in engagement with the end cap 14, the output frequency of the variable frequency microwave output source 150 would have to be decreased from some value as the piston moved from left to right in FIG. 3. One method of accomplishing this would be to provide an initial count in counter 132 corresponding to an initial output frequency of the microwave source 150. The counter 132 would then be decremented instead of being incremented with the result that the output voltage of the digital to analog converter 148 would decrease as the piston 18 moved from end cap 14 toward end cap 16. With such an arrangement, the output frequency is decremented until the piston moves to a position corresponding to a resonant condition whereupon the output frequency is again decremented, and so on. The counter 130 is incremented each time a resonant condition is detected and the total count in counter 130 represents the distance traversed by piston 18 from end cap 14.

It will, of course, be appreciated that the hard wired arrangement shown in FIG. 3 could be implemented in a microprocessor in which the counters thereof would be loaded in accordance with the principles of the operation of the system shown in FIG. 3.

In summary, the system of FIG. 3 operates as an encoder which develops a count in counter 130 which corresponds to predetermined positions of the piston 18 as it traverses the entire length of the cylinder 12 from some reference position.

Figures 5, 6:
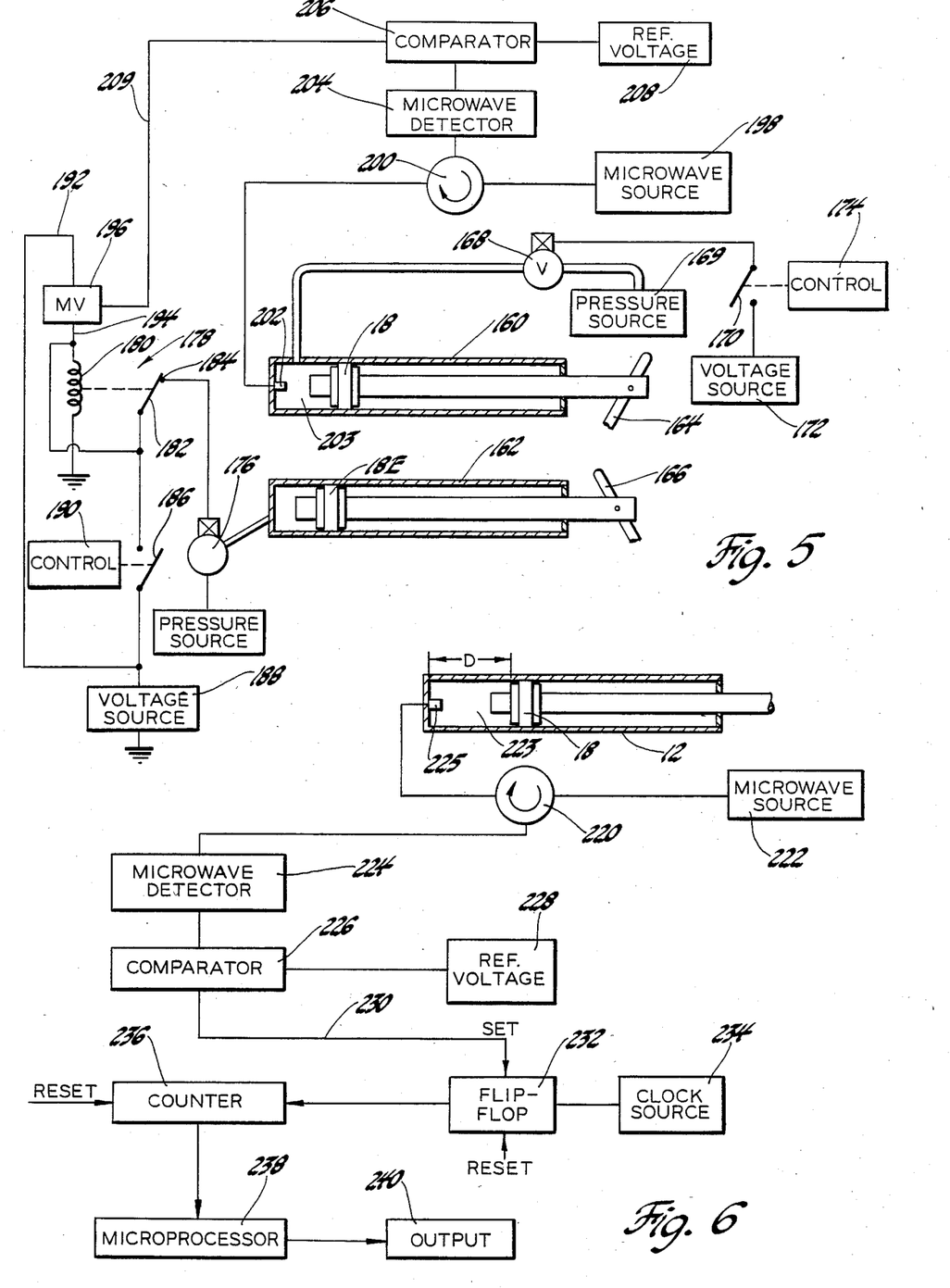
FIG. 5 is a schematic circuit diagram of a microwave position sensing system that is capable of controlling sequential operations of a plurality of piston-cylinder combinations.
FIG. 6 is a schematic circuit diagram of a microwave system that is capable of determining the speed of movement of a piston.

Referring now more particularly to FIG. 5, a system is illustrated that utilizes microwave position sensing for controlling two pneumatic cylinders which is operative to provide collision avoidance between devices operated by the cylinders. In FIG. 5, the reference numerals 160 and 162 designate respectively pneumatic cylinders which are operative to move links 164 and 166. The system of FIG. 5 is arranged such that the cylinder 162 is not actuated until the piston 18 of cylinder 160 has moved to a predetermined position. The purpose of this arrangement is to prevent the links 164 and 166 from engaging each other. Thus, the work station or machine tool may require sequential operation of link 166 and link 164, and with the system of this invention, the sequence is maintained in a certain relationship since cylinder 162 cannot be actuated until the piston 18 of cylinder 160 has reached a certain position. In FIG. 5, the exhaust valves for connecting one side of the piston to atmosphere have not been illustrated in order to simplify the description of the FIG. 5 embodiment. In FIG. 5, the reference numeral 168 designates a solenoid valve that is connected between a source of compressed air 169 and the left side of cylinder 160. The solenoid valve 168 is controlled by a switch 170 connected to a voltage source 172, and the switch 170 is controlled by a control device 174. When switch 170 is closed, the portion of the cylinder 160, to the left of piston 18, is pressurized to cause the piston 18 to move from left to right in FIG. 5 and therefore shift the link 164.

The left side of piston 18E, of pneumatic cylinder 162, can be pressurized whenever solenoid valve 176 is energized. This will cause the piston 18E to move from left to right in FIG. 5 with a consequent movement of link 166. The energization of the solenoid of solenoid valve 176 is controlled by a relay generally designated by reference numeral 178. The relay 178 has a relay coil 180 which operates a movable contact 182 that cooperates with a fixed contact 184. The contacts 182 and 184 are connected in series with a switch 186 and with a voltage source 188. The closure of switch 186 is controlled by a control device 190 which operates the switch 186 closed when it is desired to actuate the pneumatic cylinder 162 to cause the link 166 to be moved. The energization circuit for relay coil 180 includes conductors 192 and 194 and a switching device that comprises a monostable multivibrator 196.

In the system of FIG. 5, the microwave signal source 198 is coupled to a circulator 200 which, in turn, is coupled to a probe or antenna 202 which supplies a microwave signal to the cavity 203 defined by the cylinder and the left end of piston 18. The circulator 200 is coupled to a microwave detector 204 which, in turn, is connected to one input of comparator 206. Another input of comparator 206 is connected to a source of reference voltage 208 and the output of comparator 206 controls the operation of the monostable multivibrator 196 via conductor 209.

The operation of the system illustrated in FIG. 5 will now be described. It is assumed that the control device 174 has closed switch 170 to cause the piston 18 to move to the right in FIG. 5 and shift the link 164. In the system of FIG. 5 it is desired that the pneumatic cylinder 162 be actuated only after the piston 18 has moved to a certain position within the cylinder 160. In order to accomplish this, the output frequency of the microwave source 198, which is applied to the cylinder 160, is selected such that the cavity 203 will only resonate in one position of the piston 18. Thus, as the piston 18 moves from left to right in FIG. 5 it will eventually reach a position at which resonance occurs in the cavity 203. When this happens the amplitude of the signal applied to the comparator 206 will exceed the reference voltage 208 and the comparator will therefore cause the monostable multivibrator 196 to be actuated to a condition in which relay coil 180 is energized. With relay coil 180 energized the movable contact 182 is shifted into engagement with fixed contact 184 and subsequently the control device 190 closes the switch 186 to thereby energize the solenoid valve 176 and cause the pneumatic cylinder 162 to be pressurized. In the arrangement of FIG. 5 the position of piston 18 is sensed and until a certain position is reached it is not possible to actuate the pneumatic cylinder 162. As soon as piston 18 reaches a certain predetermined position the pneumatic cylinder 162 can be actuated. With this arrangement positive sequential operation of cylinders 160 and 162 is assured by use of microwave sensing of the position of piston 18.

Referring now to FIG. 6, a system is illustrated that is capable of determining the speed of movement of piston 18. In the system of FIG. 6 a 3-port circulator 220 is again provided which is connected to a microwave signal source 222 and a microwave probe or antenna 225 is adapted to excite the cavity 223 with microwave signals. The 3-port circulator 220 is coupled to a microwave detector 224 which, in turn, is connected to a comparator 226. This comparator compares the output of the microwave detector 224 with a reference voltage 228 and develops a signal on output line 230 whenever a resonant condition exists in cavity 223. The output of comparator 226 is connected to the set input of a flip-flop 232 which, when set by comparator 226, causes the clock pulses developed by clock source 234 to be applied to an input of a counter 236. The counter 236 is coupled to a microprocessor or digital computer 238 which has an output supplied to a speed indicator output unit designated by reference numeral 240. Both the counter 236 and the flip-flop 232 have reset inputs as indicated.

The operation of the system shown in FIG. 6 will now be described. Assuming that piston 18 is positioned as far as possible to the left in FIG. 6, the counter 236 and flip-flop 232 are reset by a control apparatus which is not illustrated. The cavity 223 is now pressurized and the piston 18 moves to the right in FIG. 6. As the piston 18 moves to the right in FIG. 6 the flip-flop 232 gates clock source pulses to the counter 236 and the counter 236 counts up at a predetermined rate. The counter 236 continues the counting of clock pulses for a period of time until the piston 18 reaches some point in its travel where the cavity 223 resonates. The resonant condition in cavity 223 produces an output at the microwave detector 224 which is of sufficient amplitude, as compared to the reference voltage 228, as to develop an output signal on conductor 230 which sets the flip-flop 232 to a state in which the clock source 234 and counter 236 are disconnected whereby the counter 236 ceases to count the clock pulses. As the piston 18 moves from a reference position, for example abutting the end cap 14, through a predetermined length D, a resonance will occur, assuming that the output frequency of the microwave signal source 222 is at some fixed frequency. The distance D can therefore be stored in the memory of the microprocessor 238. The count obtained in counter 236 from the time that the piston 18 begins to move from a reference position through the distance D represents time. Therefore, the microprocessor 238 is programmed to divide the distance D by the number of clock pulses accumulated in counter 236 and this result can be expressed as the speed of movement of the piston 18 since, in effect, the microprocessor 238 has divided time by distance. The output of the microprocessor 238 can be applied to an output unit 240 which may comprise a digital display or a register in which the output speed of the piston 18 is contained for control purposes.

Figure 7:
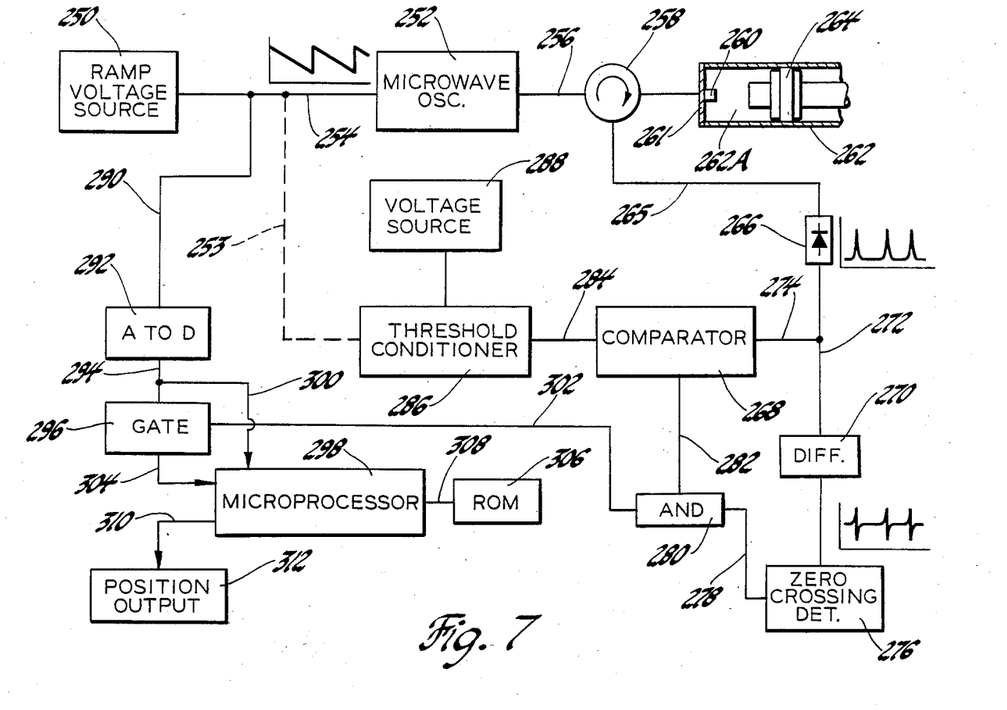
FIG. 7 is a schematic circuit diagram of a microwave piston position determining apparatus where the frequency of the microwave signal supplied to the cylinder is swept between two magnitudes.
Figure 8:
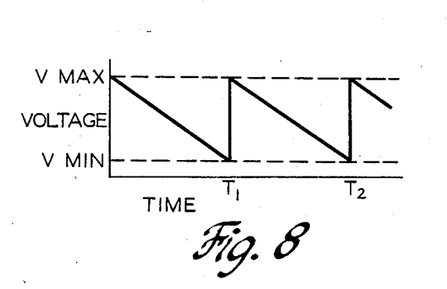
FIGS. 8, 9, 10 and 11 illustrate voltage waveforms that exist in the system of FIG. 7.

Referring now to FIG. 7, a microwave position sensing system is illustrated wherein the microwave signal supplied to the cylinder cavity is ramped in frequency between high and low magnitudes. In FIG. 7, the reference numeral 250 designates a ramp or sawtooth voltage source or generator which develops the ramp voltage illustrated in FIGS. 7 and 8. As best illustrated in FIG. 8, the ramp voltage varies between direct voltage levels $V_{max}$ and $V_{min}$ and this ramping repeats at a predetermined frequency. At time periods $T_1$ and $T_2$ the voltage flies back to the $V_{max}$ level and the time periods of all the ramps are the same.

Figure 9:
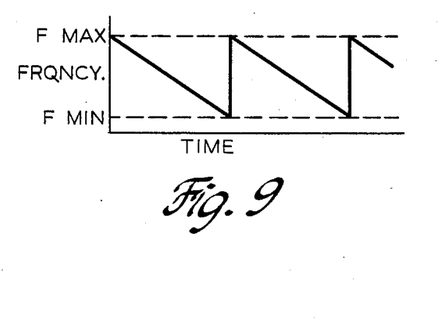

The ramp voltage developed by source 250 is applied to a microwave oscillator 252 by line 254. The oscillator 252 is of a type that has an output frequency that is dependent upon the magnitude of its input voltage. Therefore, the frequency of the microwave signal developed by oscillator 252 and applied to line 256 varies in the same manner as the ramp input voltage. Thus, the frequency of the microwave signal applied to line 256 varies in a ramp or sawtooth fashion between the magnitude $F_{max}$ and $F_{min}$ as depicted in FIG. 9.

Figure 10:
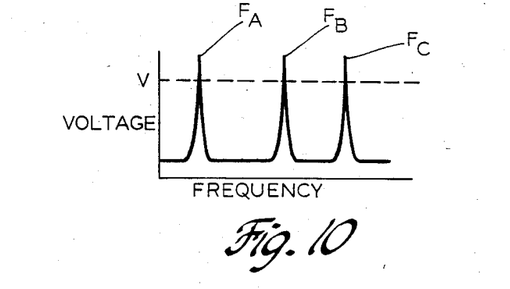

The line 256 is connected to one port of a 3-port circulator 258. Another port of this circulator is connected to a probe or antenna 260 that is located in the cylinder 262. The piston 264 reciprocates within the cylinder and is moved by selective application of pressurized air to the cylinder by a system that has not been illustrated. Still another port of circulator 258 is connected to a microwave cable 265 which in turn is connected to a microwave detector 266. The microwave detector is connected to a comparator 268 and to a differentiator 270 by lines 272 and 274. The output voltage of microwave detector 266, which is applied to lines 272 and 274, is shown in FIGS. 7 and 10.

Figure 11:
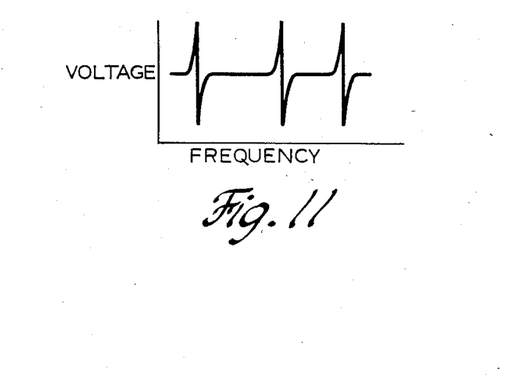

The output of differentiator 270 is connected to a zero crossing detector 276. The output voltage of differentiator 270 is depicted in FIGS. 7 and 11. The output of the zero crossing detector 276 is applied to an AND gate 280 by line 278. The AND gate 280 also responds to the output of comparator 268 since it is connected thereto by line 282.

The comparator 268 compares the voltage on line 274 (output of detector 266) with a referance voltage applied to line 284 by a threshold conditioner 286 connected to voltage source 288. As will be more fully described hereinafter, the comparator applies an output voltage to AND gate 280 when the voltage on line 274 (detector output) exceeds the reference voltage on line 284.

The output of ramp voltage generator 250 is connected to a line 290 which is connected to an analog to digital converter 292. The converter 292 converts the analog input ramp voltage to a digital signal which is applied to line 294. The line 294 is connected to a gate circuit 296 and to a microprocessor or digital computer 298 via line 300. The gate circuit 296 is connected to AND gate 280 by line 302 and to microprocessor 298 by line 304. When the AND gate 280 applies a voltage to conductor 302 the gate circuit 296 is biased conductive to connect the converter 292 to an input of the microprocessor 298 via line 304.

The microprocessor 298 is connected to a read only memory designated by reference numeral 306 via line 308. The microprocessor has an output coupled to line 310 which feeds a position output device 312. As will be more fully described hereinafter, the read only memory contains a lookup table of values which relates the position of piston 264 relative, for example to the left end cap 261 of cylinder 262 as a function of the number of resonances that occur and the frequency of these resonances that occur during one ramp transition from $F_{max}$ to $F_{min}$.

The operation of the system illustrated in FIG. 7 will now be described. Let it be assumed that the piston 264 has been moved all the way to the left in FIG. 7 to an initial position. If the cylinder 262 is now pressurized so that the cavity 262A is supplied with pressurized air the piston 264 will begin to move to the right in FIG. 7. As the piston 264 is moving a microwave signal is applied to cavity 262A which varies in a sawtooth fashion as illustrated in FIG. 9. During one ramp the frequency of the microwave signal applied to cavity 262A will therefore vary between $F_{max}$ and $F_{min}$. The reflected microwave signal is applied to circulator 258 and then to the microwave detector 266 via line 265. The number of resonant amplitude variation peaks that occur will depend upon the distance of the left edge of the piston 264 from the end cap 261. Since the frequency is varied at a rate which is high, compared to the rate of movement of piston 264, the detected microwave signal will be a snap-shot version of the reflected signal developed in cavity 262A. The reflected microwave signal, for a given position of piston 264, will have a predetermined number of resonant peaks and each peak will occur at a predetermined frequency between $F_{max}$ and $F_{min}$. By way of example, let it be assumed that the piston 264 has been positioned such that when the frequency is ramped or swept between $F_{max}$ and $F_{min}$ three resonant peaks are developed as illustrated in FIG. 10. These resonant peaks have been designated as $F_A$, $F_B$ and $F_C$. The peak $F_A$ will be the first peak developed as the frequency is swept between $F_{max}$ and $F_{min}$. A further decrease in frequency, along the ramp function shown in FIG. 9, will cause the resonant peak $F_B$ to be developed and still a further decrease in frequency toward $F_{min}$ will cause the resonant peak $F_C$ to be developed.

For each position of piston 264 relative to end cap 261 a unique pattern of resonant peaks will be developed which correspond to the particular position of the piston.

The table of values contained in the read only memory 306 relate the distance of the piston 264 from the end cap 261 to the number of resonances developed in cavity 262A and to the frequency of at least some of these resonances that occurred during one ramp voltage transition. Thus, the look-up table can contain a length or distance value that is, for example related to a condition of operation in which three resonances have occurred and where the first two resonances are at frequencies $F_A$ and $F_B$. Further, the look-up table may relate distance or displacement to the number of resonances that occurred and the frequency of only the first highest frequency resonance that occurred, for example $F_A$. The high frequency resonances are utilized because they have the best position resolution.

The reference voltage applied to line 284 by the threshold conditioner 286 is shown by a dotted line in FIG. 10 and identified as voltage V. The threshold conditioner 286 accepts the source voltage of voltage source 288 and translates it to the level V. Whenever the output of the detector 266 exceeds the reference voltage V the comparator develops a signal on line 282 which is applied to AND gate 280. The differentiator 270 differentiates the peaked signal shown in FIG. 10 to provide the signal shown in FIG. 11. When the signal shown in FIG. 11 goes through zero the zero crossing detector 276 applies a signal to the AND gate 280. This zero crossing will occur at the peak of the signal shown in FIG. 10. The AND gate now has signals from the comparator 268 and the zero crossing detector 276 which cause it to develop a signal on line 302. This signal opens the gate circuit 296 so that the digital representation of the frequency of the signal applied to cavity 262A is applied to line 304 as an input to the microprocessor 298.

The microprocessor 298 is arranged to detect and store both the number of resonances that occur during one ramp transition and also the frequency of these particular resonances. Using the previously mentioned example of three resonances, the microprocessor 298 via a suitable register or counter will count the number of resonances that occurred which in this example is three. The microprocessor in another register or counter will contain information regarding the frequencies $F_A$, $F_B$ and $F_C$. The microprocessor 298 now has stored information indicative of the fact that three resonances have occurred and has information regarding the frequency of each of these resonances.

The line 300 continuously applies a digital representation of the instantaneous frequency of the oscillator 256 to the microprocessor 298. The microprocessor is arranged such that when the output frequency of oscillator 252 reaches $F_{min}$ the registers or counters that have been monitoring both the number of resonances and the frequency of each resonance are reset to zero and they are then ready to accept information that is developed by the next ramp transition from $F_{max}$ to $F_{min}$. The microprocessor now addresses the read only memory 306 in accordance with the stored information (number of resonances and their frequencies) in order to retrieve a digital number that represents the displacement of the piston 264 from end cap 261 as a function of the number of resonances that have occurred and the frequencies of one or more of the resonances. By way of example, the look-up table may contain values such that one distance or displacement value may correspond to three resonances and the frequency of the first two resonances is respectively $F_A$ and $F_B$. As mentioned, it is possible for the look-up table to contain displacement values that are related to the number of resonances that occurred and only one of the frequencies, preferably the first higher frequency resonance that occurs.

The information that is retrieved from ROM 306 is processed by the microprocessor 298 and applied to a position output device 312. The device 312 may take the form of a counter or register which contains a digital representation of the displacement of the piston 264 from the end cap 261. This information can take various formats, depending upon how piston displacement is to be utilized in a given system. The position output device 312 could take the form of a switching device which is switched from one state to another whenever the piston 264 is displaced from end cap 261 by a predetermined amount.

It will of course be appreciated that if only one value of displacement is to be detected the read only memory 306 can contain only one displacement value related to a given number of resonances and one or more of their frequencies.

One of the advantages of the system illustrated in FIG. 7 is that a single microwave oscillator 252 could be provided to feed a plurality of pneumatic cylinders. In this regard the information contained in the ROM 306 can contain values that are selected to match a given size cylinder. Further, the system is easily revised in order to accommodate different size cylinders by simply providing a ROM that is related to the dimensions of the cylinder to be monitored.

The microprocessor 298 contains a program for causing it to perform sequentially the functions described above. The program may be stored in a read only memory which has not been illustrated.

As previously mentioned the piston rod extension 20A, at times, projects into the recess 22 formed in the end cap 14. The purpose of the bore 20B is to accommodate the antenna 30 so that the antenna can project into the end cap 14 without interfering with the impact cushioning function of extension 20A and recess 22.

The hydraulic actuators have been disclosed as being operated by air but other fluid mediums could be utilized such as oil. The behavior of the piston-cylinder cavity to a microwave signal is influenced by changes in the dielectric constant of the cavity medium. This dielectric constant, for example, changes very slightly with temperature and pressure for air and oil and is affected to varying degrees by contamination. One example of contamination is the addition of water to oil and in such a case the loss tangent of oil is not significantly affected by water addition in small quantities.

The threshold conditioner 286, shown in FIG. 7, controls the reference voltage applied to comparator 268 from voltage source 288. The threshold conditioner can apply a fixed value voltage, such as the voltage V illustrated in FIG. 10, to the comparator. The threshold conditioner can be arranged such that it develops a variable output voltage that is applied to the comparator. Thus, where the amplitude of the resonant variations, shown in FIG. 10, vary from one to another, dependent upon the frequency of the microwave signal applied to cavity 262A it may be desirable to vary the reference voltage applied to comparator 268 as a function of the frequency of the signal being applied to cavity 262A. In order to accomplish this the threshold conditioner may comprise known circuitry that varies its output voltage as a function of the output frequency of microwave source 252. Thus, the threshold conditioner can be arranged to have an input connected to the output of ramp voltage source by conductor 253, illustrated by a dotted line in FIG. 7. With this arrangement the output of the threshold conditioner would follow the ramp output voltage such that the reference voltage applied to comparator 268 will decrease as ramp voltage and hence output frequency of microwave source 252 decreases. This means that lower amplitude resonant variations that might occur at the lower frequency range of the microwave source 252 will be detected by comparator 268. Further, the conditioner 286 could be arranged such that its output does not exactly follow the ramp output voltage of ramp voltage source 250. Thus, the amplitude of the resonances developed in cavity 262A can be determined over the swept frequency range and over the range of displacement of piston 264 and the output voltage of conditioner 286 can be varied so as to detect all resonances of interest.

In order to determine the magnitudes of the look-up table of values, to be stored in read only memory 306, a cylinder of a given known size is supplied with a microwave signal and its frequency is varied between $F_{max}$ and $F_{min}$. The piston is maintained stationary at some known displacement from an end cap of the cylinder and the amount of displacement, number of resonances that are being developed and the frequencies of the signal at the time a resonance occurs, are recorded. The piston is now moved to another position and the parameters just described are again recorded. By following this procedure, a table of values can be obtained for a plurality of positions of the piston beginning at a reference position and ending at full displacement of the piston.

In regard to the relationship between the speed of movement of piston 264 and the frequency of ramp generator 250, the maximum speed of movement of the piston may be, for example 100 inches per second and the frequency such that the time period between $T_1$ and $T_2$, shown in FIG. 7, is about 1.25 milliseconds. This means that the reflected signal will be sampled at each 0.125 inches of movement of the piston at the maximum rate of movement of the piston.

In regard to the operation of the system shown in FIG. 7, the only time that gate circuit 296 is conductive, to connect converter 292 and microprocessor 298, is for periods of time in which the AND gate 280 applies a signal to gate 296 to bias it conductive. At other times the gate 296 is nonconductive. The net effect of this is that the microprocessor receives a digital signal each time a resonant voltage transition occurs that has a magnitude which exceeds the reference voltage on conductor 284 and the digital signal represents the instantaneous frequency of the microwave signal being applied to cavity 262A at the time a resonance occurs. Therefore, the microprocessor is supplied with information indicative of the number of resonances that occur and the frequency of the signal at the time each resonance occurred during each ramp transition of frequency between $F_{max}$ and $F_{min}$.

The voltage V, in FIG. 10, is illustrated as a positive voltage but it could be a negative voltage. Thus, the voltages to be compared can have various polarities as long as the system is capable of detecting resonant amplitude variations that occur in the reflected signal.

By way of example, the frequencies $F_{max}$ and $F_{min}$ may respectively be about 8 GHz and 4 GHz where the internal diameter of the cylinder 262 (FIG. 7) is 2.25 inches.

In regard to the antenna arrangement illustrated in FIG. 2 it is pointed out that this arrangement excites the cavity defined by the piston and cylinder in the $TM_{01}$ circular waveguide mode.

The curve illustrated in FIG. 4 generally takes the form of a hyperbola.

The embodiments of the invention in which an exclusive property or privilege is claimed are defined as follows:

1. A method of determining the position of a piston movable in a cylinder of a hydraulic actuator, the steps comprising, applying a microwave signal to a cavity defined by the piston and the interior of said cylinder and detecting a reflected microwave signal while the piston is being moved in the cylinder by the application of fluid pressure to the cylinder, repeatedly varying the frequency of the microwave signal applied to the cavity between two values that are of such a magnitude that the reflected microwave signal has one or more resonant amplitude variations the number of which are a function of the position of the piston relative to an end of said cylinder, developing data from said reflected microwave signal that is indicative of the number of resonant amplitude variations that occur and the frequency of the microwave signal applied to the cavity at the time at least one of said resonant amplitude variations occurred and converting said data to piston position information.

2. Apparatus for determining the position of a piston movable in a cylinder of a hydraulic actuator comprising, a microwave signal generator, means for applying the output of said generator to a cavity defined by the piston and the interior of said cylinder, means for detecting a reflected microwave signal while the piston is being moved in the cylinder by the application of fluid pressure to the cylinder, means for repeatedly varying the frequency of the microwave signal applied to the cavity between two values that are of such a magnitude that the reflected microwave signal has one or more resonant amplitude variations the number of which are a function of the position of the piston relative to an end of said cylinder, means responsive to said reflected signal for developing data from said reflected microwave signal that is indicative of the number of resonant amplitude variations that occur and the frequency of the microwave signal applied to the cavity at the time at least one of said resonant amplitude variations occurred and means for converting said data to piston position information.

3. Apparatus for determining the position of a piston movable in a cylinder of a hydraulic actuator comprising, a microwave signal generator, means for applying the output of said generator to a cavity defined by the piston and the interior of said cylinder, means for detecting a reflected microwave signal while the piston is being moved in the cylinder by the application of fluid pressure to the cylinder, means for repeatedly varying the frequency of the microwave signal applied to the cavity in a sawtooth fashion between two values that are of such a magnitude that the reflected microwave signal has one or more resonant amplitude variations the number of which are a function of the position of the piston relative to an end of said cylinder, means responsive to said reflected signal for developing data from said reflected microwave signal that is indicative of the number of resonant amplitude variations that occur and the frequency of the microwave signal applied to the cavity at the time at least one of said resonant amplitude variations occurred and means for converting said data to piston position information.

4. Apparatus for determining the position of a piston movable in a cylinder of a hydraulic actuator comprising, a microwave signal generator, means for applying the output of said generator to a cavity defined by the piston and the interior of said cylinder, means for detecting a reflected microwave signal while the piston is being moved in the cylinder by the application of fluid pressure to the cylinder, means for repeatedly varying the frequency of the microwave signal applied to the cavity between two values that are of such a magnitude that the reflected microwave signal has one or more resonant amplitude variations the number of which are a function of the position of the piston relative to an end of said cylinder, means responsive to said reflected signal for developing data from said reflected microwave signal that is indicative of the number of resonant amplitude variations that occur and the frequency of the microwave signal applied to the cavity at the time at least one of said resonant amplitude variations occurred, a memory containing information in the form of a look-up table of values that relates piston position to a number of said resonant variations and the frequency of at least some of the resonant variations, and means for addressing said memory in accordance with said data to obtain piston position information.

5. Apparatus for providing an electrical signal that is a function of the displacement of a piston of a hydraulic cylinder from a reference position comprising, a variable frequency microwave signal generator, means for applying the output of said generator to a cavity defined by the piston and the interior of said cylinder, means for detecting a reflected microwave signal while the piston is being moved in the cylinder by the application of fluid pressure to the cylinder, said reflected signal exhibiting a resonant amplitude variation at predetermined positions of the piston at corresponding microwave signal frequencies, means for developing an electrical position signal at each occurrence of a resonant variation, means responsive to the occurrence of each position signal for causing the frequency of said generator to vary in a direction that is related to the direction of movement of said piston and such that the frequency is varied by an amount to cause a subsequent resonant variation to occur as the piston moves by a certain amount, and means responsive to the number of resonant variations that occur during displacement of said piston from a reference position for indicating the displacement of the piston from a reference position.

6. A microwave piston position sensing apparatus for sensing the position of a piston movable in a cylinder of a hydraulic actuator comprising, a microwave signal generator, means for applying the output of said generator to a cavity defined bv piston and the interior of said cylinder, means for detecting a reflected microwave signal while the piston is moving in said cylinder, means for causing said signal generator to develop an output at a first constant frequency when the piston is moving in one direction and an output at a second constant frequency when the piston is moving in an opposite direction, and means responsive to variations in the amplitude of said reflected signal for producing a first piston position signal when the piston is moving in said one direction and reaches a predetermined position and for producing a second piston position signal when the piston is moving in said opposite direction and reaches a predetermined position.

* * * * *